US008132468B2

(12) United States Patent
Radivojevic

(10) Patent No.: US 8,132,468 B2
(45) Date of Patent: Mar. 13, 2012

(54) FLEXURAL DEFORMATION SENSING DEVICE AND A USER INTERFACE USING THE SAME

(76) Inventor: Zoran Radivojevic, Cambridge (GB)

( * ) Notice: Subject to any disclaimer, the term of this patent is extended or adjusted under 35 U.S.C. 154(b) by 619 days.

(21) Appl. No.: 12/156,468

(22) Filed: May 29, 2008

(65) Prior Publication Data
US 2009/0293631 A1   Dec. 3, 2009

(51) Int. Cl.
*G01L 1/00* (2006.01)
(52) U.S. Cl. .......................................................... 73/777
(58) Field of Classification Search .................. 73/777
See application file for complete search history.

(56) References Cited

U.S. PATENT DOCUMENTS

| | | | | |
|---|---|---|---|---|
| 4,634,917 | A | 1/1987 | Dvorsky et al. | 310/328 |
| 5,013,874 | A | 5/1991 | De Bruyne et al. | 178/18 |
| 5,760,530 | A * | 6/1998 | Kolesar | 310/339 |
| 6,128,961 | A * | 10/2000 | Haronian | 73/774 |
| 6,286,226 | B1 | 9/2001 | Jin | 33/706 |
| 6,452,584 | B1 * | 9/2002 | Walker et al. | 345/158 |
| 6,848,320 | B2 * | 2/2005 | Miyajima et al. | 73/763 |
| 7,051,945 | B2 | 5/2006 | Empedocles et al. | 235/492 |
| 7,312,096 | B2 * | 12/2007 | Kurtz | 438/50 |
| 7,777,478 | B2 * | 8/2010 | Dai et al. | 324/109 |
| 2005/0034529 | A1 | 2/2005 | Tang et al. | 73/777 |
| 2008/0067618 | A1 * | 3/2008 | Wang et al. | 257/415 |
| 2008/0070010 | A1 * | 3/2008 | Dravid et al. | 428/195.1 |

FOREIGN PATENT DOCUMENTS
JP    63208734    8/1988

OTHER PUBLICATIONS

Notification of Transmittal of the International Search Report and the Written Opinion of the International Searching Authority (3 pages), International Search Report (5 pages) and Written Opinion of the International Searching Authority (9 pages), 17 pages total.

* cited by examiner

*Primary Examiner* — Lisa Caputo
*Assistant Examiner* — Octavia Davis

(57) ABSTRACT

A sensing device is provided for measuring flexural deformations of a surface. Such a sensing device may be used as a user interface in portable electronic devices. The sensing device comprises at least one cell. The cell comprises a first electrode, a central electrode, a second electrode, a first piezoelectric sensing layer placed between the first electrode and the central electrode, a second piezoelectric sensing layer placed between the central electrode and the second electrode, and a circuit connected to the first, second and the central electrodes. The circuit is configured to measure a first electrical signal between the first electrode and the central electrode, and a second electrical signal between the second electrode and the central electrode. At least one of the first electrical signal and the second electrical signal is responsive to an external stress applied on the sensing device.

15 Claims, 7 Drawing Sheets

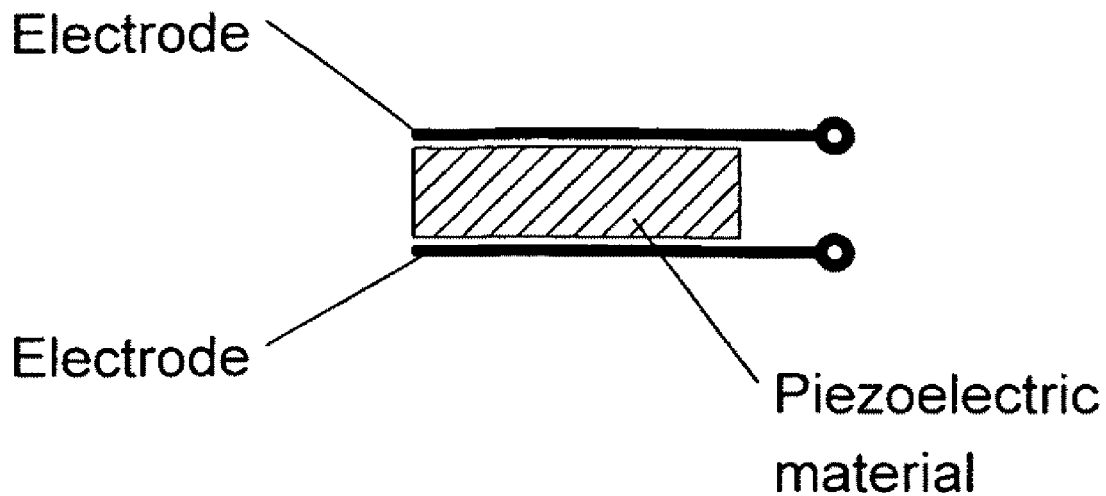
FIG. 1 (a) (Prior Art)
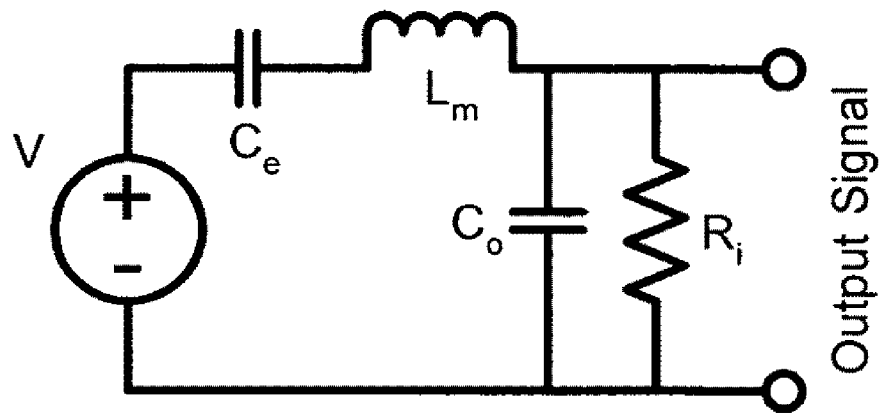
FIG. 1 (b) (Prior Art)

FLEXURAL DEFORMATION SENSING DEVICE AND A USER INTERFACE USING THE SAME

TECHNICAL FIELD

This disclosure relates to sensing devices. In particular, this disclosure relates to sensing devices capable of measuring flexural deformations of a surface, and portable electronic devices using such a sensing device as a user interface.

BACKGROUND ART

A user interface is a very important part of an electronic device. How easy and comfortable the user uses the interface for controlling the electronic device may ultimately determine the usefulness, acceptance and user experience of the electronic device. There have been numerous interaction methods between user and user interface, and new interaction methods are continuously being developed. Human nature determines that the most natural interaction between a person and an external object is through the human skin. Therefore, it would be preferred if a user interface could be so designed that it seamlessly integrates with a user's skin layer and it responds to contorting of the skin for communicating signals. Such an interface is further preferred if the operation of the interface does not affect or compromise the user's ordinary gesture and behavior.

When a flat elastic object, such as a thin sheet of rubber (an analogue to human skin), is bent or stretched under an applied external force, it forms a complex deformed shape. Such a deformed shape contains information about the intensity and direction of the external force. By monitoring the deformed shape in real time, it is possible to obtain dynamic information of the deformation process under the external force. Measuring values such as strain, pressure and flexure of a three-dimensional (3D) object normally requires a complex set of sensors placed on the object. Conventional systems for measuring conformation of mechanical objects are based either on an array of strain gauges or on optical scanning methods. In these methods, miniaturization and integration levels are relatively low. In the case of using strain gauges, potential for portability of the measuring device is limited. In the case of using optical scanning methods, digitalized readings from the distinct sensors are used as a basis for computing the conformation based on a model of the mechanical structure. The computation of the conformation depends on the complexity of the system and the number of degrees of freedom. Furthermore, optical systems (e.g. cameras) require certain length to focus on the monitored object, which limits the operational size of the system and requires the camera to be placed outside of the monitored object.

Therefore, what is needed is a sensor module for sensing complex 3D flexural deformations that has high miniaturization and integration levels for being used in portable electronic devices.

This disclosure, in general, relates to design and manufacturing of a sensor module that is capable of detecting complex 3D flexural deformation of an object. For the purpose of utilizing the concept of the present invention, it is assumed that such an object has a large surface area that is subject to compressing, bending, stretching, folding, etc. For example, such an object may be a flat sheet (rubber or plastic), a cylinder, or a sphere. The sensor module utilizes piezoelectric effect of a material, and an optimum arrangement of the material is achieved with the help of nanotechnologies and manipulation capabilities of the material at micrometer to nanometer scale (referred to as nanoscale hereinafter). With the high miniaturization and integration levels, the sensor module can be used, for example, as a user interface or a sensing unit for portable electronic devices. As a particular application, the sensor module of the present invention may be used for gesture recognition and hand/finger movement tracking.

SUMMARY OF THE INVENTION

In a first aspect of the invention, an apparatus is provided. The apparatus comprises at least one cell. The cell comprises a first electrode, a central electrode, a second electrode, a first sensing layer placed between the first electrode and the central electrode, a second sensing layer placed between the central electrode and the second electrode, a circuit connected to the first, second and the central electrodes, said circuit being configured to measure a first electrical signal between the first electrode and the central electrode, and a second electrical signal between the second electrode and the central electrode. At least one of the first electrical signal and the second electrical signal is responsive to an external stress applied on the cell.

In the apparatus, the first sensing layer and the second sensing layer may each comprise a piezoelectric material. The piezoelectric material may comprise high aspect ratio crystallites of the piezoelectric material. The high aspect ratio crystallites may have a diameter of 1-100 nm and a length of 1-1000 μm, and the high aspect ratio crystallites may be zinc oxide (ZnO) nanowires, barium titanate ($BaTiO_3$) nanowires, or carbon nanotubes.

In the apparatus, the first sensing layer may comprise piezoelectric crystallites aligned substantially in a first direction parallel to the first sensing layer, the second sensing layer may comprise piezoelectric crystallites aligned substantially in a second direction parallel to the second sensing layer. The first direction and the second direction are not parallel to each other.

The first electrical signal may be a voltage difference between the first electrode and the central electrode, and the second electrical signal may be a voltage difference between the second electrode and the central electrode. Alternatively, the first electrical signal may be a change of resistance between the first electrode and the central electrode, and the second electrical signal may be a change of resistance between the second electrode and the central electrode.

In the apparatus, at least one of the first electrical signal and the second electrical signal is proportional to the external stress applied on the cell.

The apparatus may further comprise a plurality of cells. The plurality of cells are arranged in a two dimensional array with a plurality of rows and a plurality of columns. The first and the second electrodes each comprise a plurality of strip electrodes and each strip electrode extends across a column of the cells. The central electrode comprises a plurality of strip electrodes and each strip electrode extends across a row of the cells. Each of the plurality of strip electrodes of the first electrode is connected to a first bus. Each of the plurality of strip electrodes of the second electrode is connected to a second bus. Each of the plurality of strip electrodes of the central electrode is connected to a third bus. The circuit is connected to each of the strip electrodes via the first, second or the third bus. The circuit may be configured to measure the first electrical signal of each cell between the first electrode and the central electrode, and the second electrical signal of each cell between the second electrode and the central electrode.

In the apparatus above, the first sensing layer and the second sensing layer may each extend across the plurality of columns and the plurality of rows. The first sensing layer may comprise piezoelectric crystallites aligned substantially in a first direction parallel to the first sensing layer, the second sensing layer comprises piezoelectric crystallites aligned substantially in a second direction parallel to the second sensing layer, and the first direction and the second direction are not parallel to each other.

Further, the first direction may be a direction parallel to the rows and the second direction may be a direction parallel to the columns.

At least one of the first electrical signal of each cell and the second electrical signal of each cell is proportional to the external stress and said signals are used for calculating a flexural deformation of the apparatus in response to an external stress.

In a second aspect of the invention, an electronic device is provided. The electronic device comprises a user interface configured to accept a user input. The user interface comprises an apparatus as disclosed above. The user input is converted into at least one of the first electrical signal and the second electrical signal for communicating to the device.

In the electronic device above, the interface may be a flexible sensor module fitted to a part of a human body. A movement of the part of the human body produces the external stress for controlling the electronic device.

In a third aspect of the invention, a method is provided. The method comprises generating at least one of a first electrical signal and a second electrical signal in response to an external stress, measuring said first electrical signal and said second electrical signal, and calculating a flexural deformation as a result of said applied stress. The stress is applied on an apparatus to cause the flexural deformation of the apparatus. The apparatus comprises at least one cell. The cell comprises a first electrode, a central electrode, a second electrode, a first sensing layer placed between the first electrode and the central electrode, a second sensing layer placed between the central electrode and the second electrode, a circuit connected to the first, second and the central electrodes. The circuit is configured to measure the first electrical signal between the first electrode and the central electrode, and the second electrical signal between the second electrode and the central electrode.

In the method, the first sensing layer and the second sensing layer may each comprise high aspect ratio crystallites of a piezoelectric material. The first sensing layer may comprise piezoelectric crystallites aligned substantially in a first direction parallel to the first sensing layer. The second sensing layer may comprise piezoelectric crystallites aligned substantially in a second direction parallel to the second sensing layer. The first direction and the second direction are not parallel to each other.

In the method, measuring the first electrical signal and the second electrical signal may comprise measuring a voltage difference between the first electrode and the central electrode and a voltage difference between the second electrode and the central electrode. Alternatively, measuring the first electrical signal and the second electrical signal may comprise measuring a change of resistance between the first electrode and the central electrode and a change of resistance between the second electrode and the central electrode.

At least one of the first electrical signal and the second electrical signal may be proportional to the external stress applied on the cell.

In the method, the apparatus may further comprise a plurality of cells. The plurality of cells may be arranged in a two dimensional array with a plurality of rows and a plurality of columns. The first and the second electrodes may each comprise a plurality of strip electrodes and each strip electrode may extend across a column of the cells. The central electrode may comprise a plurality of strip electrodes and each strip electrode may extend across a row of the cells. Each of the plurality of strip electrodes of the first electrode may be connected to a first bus, each of the plurality of strip electrodes of the second electrode may be connected to a second bus, each of the plurality of strip electrodes of the central electrode may be connected to a third bus, the circuit may be connected to each of the strip electrodes via the first, second or the third bus. Measuring the first electrical signal and said second electrical signal may further comprise measuring the first electrical signal of each cell between the first electrode and the central electrode, and the second electrical signal of each cell between the second electrode and the central electrode.

In the method, the first sensing layer and the second sensing layer may each extend across the plurality of columns and the plurality of rows. The first sensing layer may comprise piezoelectric crystallites aligned substantially in a first direction parallel to the first sensing layer, the second sensing layer may comprise piezoelectric crystallites aligned substantially in a second direction parallel to the second sensing layer. The first direction and the second direction are not parallel to each other.

In the method, the first direction may be a direction parallel to the rows and the second direction may be a direction parallel to the columns. At least one of the first electrical signal of each cell and the second electrical signal of each cell is proportional to the external stress.

The method may further comprise repeatedly measuring the first electrical signal and the second electrical signal in a predetermined time interval and calculating flexural deformations in the time interval.

The method may further comprise using the first electrical signal and/or the second electrical signal for controlling an electronic device.

In the fourth aspect of the invention, a computer program product is provided. The computer program product comprises a computer readable storage medium storing program codes thereon for use by an electronic device. The program codes comprise instructions for measuring a first electrical signal and a second electrical signal, and instructions for calculating a flexural deformation as a result of an external stress. The stress is applied on an apparatus to cause said flexural deformation of the apparatus. The apparatus comprises at least one cell, said cell comprises a first electrode, a central electrode, a second electrode, a first sensing layer placed between the first electrode and the central electrode, a second sensing layer placed between the central electrode and the second electrode, and a circuit connected to the first, second and the central electrodes. The circuit is configured to measure the first electrical signal between the first electrode and the central electrode, and the second electrical signal between the second electrode and the central electrode. At least one of the first electrical signal and the second electrical signal is generated in response to the external stress.

BRIEF DESCRIPTION OF THE DRAWINGS

The features and advantages of the invention will become apparent from a consideration of the subsequent detailed description presented in connection with accompanying drawings, in which:

FIG. 1(*a*) is a schematic illustration of a simple piezoelectric sensor;

FIG. 1(*b*) is an electronic model of the piezoelectric sensor;

FIG. 2(*b*) illustrates an arbitrary stress in the sensing layer;

FIG. 2(*c*) is a schematic illustration of a surface to be traced in 3D with two sensing layers misaligned in axis of sensitivity placed on the surface;

FIG. 8(*b*) illustrates a tubular sensor module wrapped around a human finger for being used as a user interface.

DETAILED DESCRIPTION

Piezoelectric effect is the ability of some materials (notably crystals and certain ceramics) to generate an electric potential in response to applied mechanical stresses. The effect finds useful applications such as the production and detection of sound, generation of high voltages, electronic frequency generation, microbalances, and ultra fine focusing of optical assemblies.

A piezoelectric sensor is a device that uses the piezoelectric effect to measure pressure, acceleration, strain or force by converting them to an electrical signal. FIG. 1(*a*) shows a simple piezoelectric sensor that is capable of generating an electrical charge in response to an external stress. Electrodes placed on the piezoelectric material detect the electrical charge when the piezoelectric material receives an external stress and the amount of the charge is related to the intensity of the stress. As shown in FIG. 1(*b*), a piezoelectric sensor can be modeled as a voltage source V that is directly proportional to the applied force, pressure, or strain. An output signal is then related to this mechanical force as if it had passed through an equivalent circuit. A model of this circuit includes the effects of the sensor's mechanical construction and other non-idealities. The inductance $L_m$ is due to the seismic mass and inertia of the sensor itself. $C_e$ is inversely proportional to the mechanical elasticity of the sensor. $C_0$ represents the static capacitance of the sensor, resulting from an inertial mass of infinite size. $R_i$ is the insulation leakage resistance of the sensor element.

Figure 2:
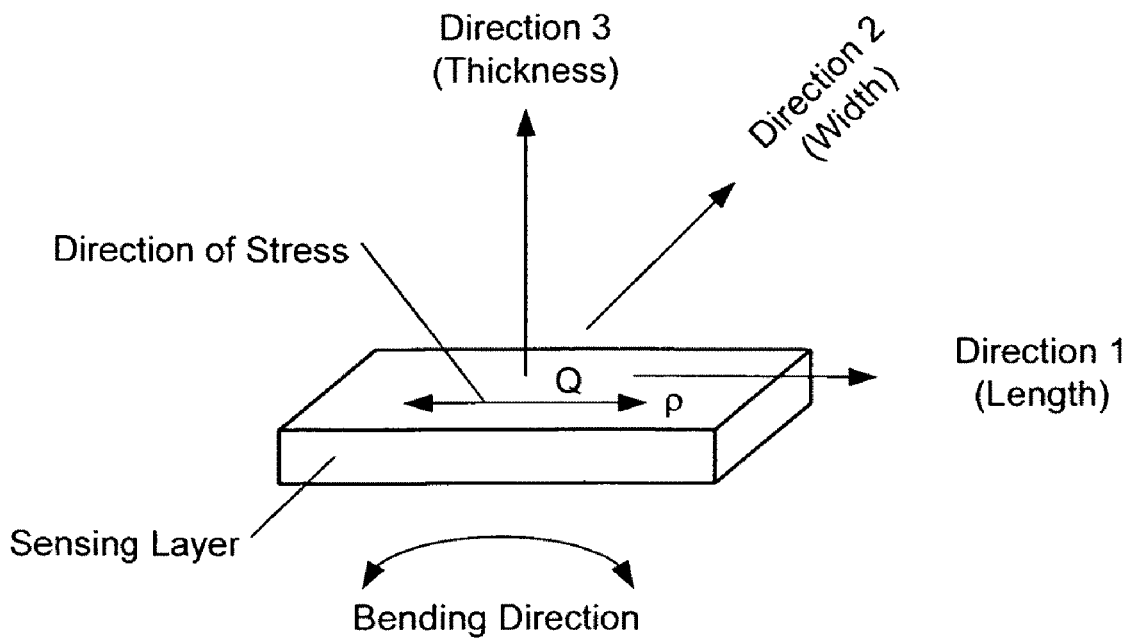
FIG. 2(*a*) is a schematic illustration of a piezoelectric thin sensing layer in relation to an external stress.
Figure 2:
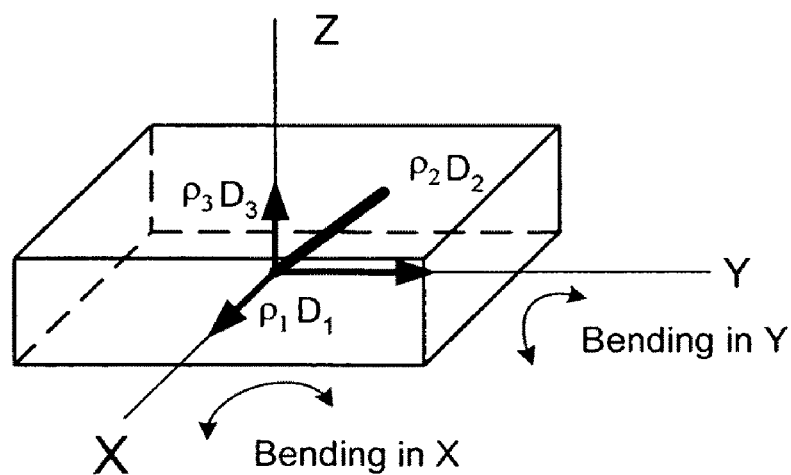
Figure 2:
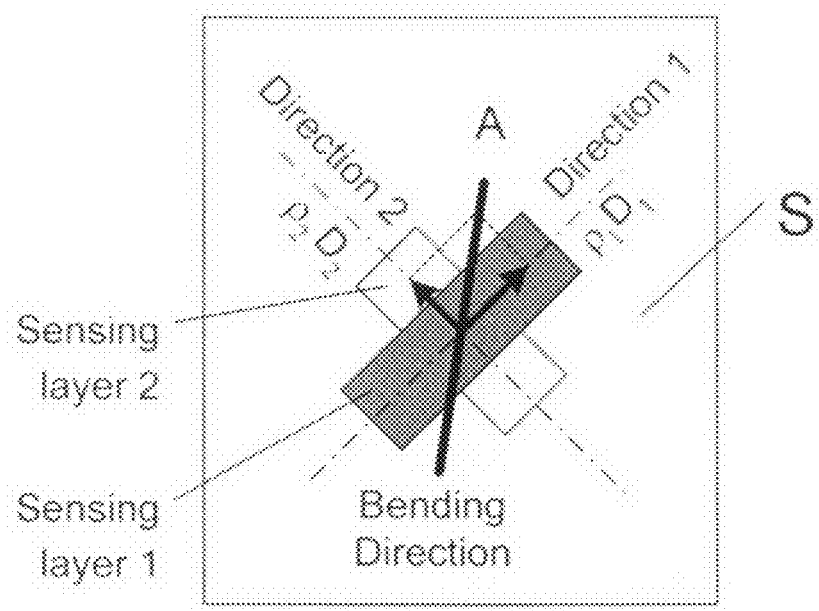

Referring now to FIG. 2(*a*), when a thin layer of a piezoelectric material receives a stress ρ, for example when it is bent along the direction of the length (Direction 1), it generates an electrical charge Q in response to the stress. Depending on the property of the piezoelectric material, Q may be proportional to the amount of stress applied. Charge Q may be positive or negative. The polarity (+/−) of the charges generated can be used to indicate the direction of the bending (i.e. whether the bending curve is concave or convex).

Referring now to FIG. 2(*b*), if the stress ρ is in an arbitrary direction, it can be considered as having a component $\rho_1$ in Direction 1 (in x axis), a component $\rho_2$ in Direction 2 (in y axis) and a component $\rho_3$ in Direction 3 (in z axis). A generated charge density D (=generated charge Q divided by active area A of the piezoelectric thin layer) by applied stress $\rho_n$ (n=1, 2 or 3) can be described by Equation 1:

$$D = \frac{Q}{A} = d_{3n}\rho_n (n = 1, 2, \text{ or } 3) \quad (1)$$

in which d is a piezoelectric coefficient.

The piezoelectric coefficient d may be different in different directions. This is called an anisotropic behavior. The anisotropic behavior of the piezoelectric materials mainly occurs in crystalline piezoelectric materials. In such materials, the generated charge varies depending on the direction that the stress is applied. The anisotropic behavior is described in the Equation 1 above by the direction-dependent piezoelectric coefficient $d_{3n}$, in which n denotes the direction 1, 2 or 3.

Generally speaking, when a thin piezoelectric layer is bent, it forms a curvature $\kappa_n$. The applied stress $\rho_n$ on the film is described by E-young's modulus of the film, l-thickness of the film, and $\kappa_a$-curvature of the layer, as depicted in Equation 2:

$$\rho_n = \frac{El}{2}\kappa_n \quad (2)$$

Plugging Equation (2) into Equation (1), the curvature of the bending and the type of the bending (convex or concave) along the direction n can be determined by measuring the amount of the generated charge and charge polarity.

As can be seen from FIG. 2(*b*), when the piezoelectric thin layer is bent along an arbitrary direction, it forms a curvature $\kappa_1$ in direction 1 (x axis) and a curvature $\kappa_2$ in direction 2 (y axis). A cumulative charge Q is generated and it can be described by Equation 3:

$$Q = \frac{ElA}{2}(d_{31}\kappa_1 + d_{32}\kappa_2) \quad (3)$$

Therefore, a detected charge Q is the result of multidirectional stimulations and it presents a lump sum of the individual directional charges.

There is no limitation on bending directions. What is needed is a simplified model for solving such a lumped charge and to provide reasonable means to associate a particular charge to a particular direction of the stimuli. FIG. 2(*c*) shows an object with a surface S. Two sensing layers 1 and 2 are placed on the surface so that when the object is bent, the sensing layers 1 and 2 are also bent to the same extent. Assuming that due to the anisotropic behavior of the piezoelectric materials as mentioned above, sensing layer 1 is more sensitive (i.e. generates more electrical charge) when it is bent along the direction 1, while sensing layer 2 is more sensitive (i.e. generates more electrical charge) when it is bent along the direction 2. Directions 1 and 2 are not parallel to each other. If the object is bent along an arbitrary direction A as shown in FIG. 2(*c*), and if each sensing layer mostly responds to a stress in one direction, the layer 1 would generate a charge density $D_1$ which is proportional to the stress component $\rho_1$ in direction 1, and the layer 2 would generate a charge density $D_2$ which is proportional to the stress component $\rho_2$ in direction 2. The magnitude and polarity of the charge densities represent the degree and direction of the flexural deformation of the surface S at the location of the sensing layers.

Therefore, sensing a complex deformation of a surface can be achieved by placing one or more sensing devices on the surface. Each sensing device comprises two individual sensing layers stacked on top of each other. Each sensing layer is mostly sensitive to a single direction (sensing direction) and two of such directions are misaligned, preferably in a large angle or perpendicular to each other. By combining two (or more) predetermined sensing direction, it is possible to realize a system for detecting complex conformal deformations of the surface in 3D.

A sensor module is constructed based on the above principle. The sensor module comprises two sensing layers. Each sensing layer is a thin film made with a piezoelectric material. Each thin film layer comprises a large number of high aspect ratio piezoelectric crystallites called nanowires. The nanowires are aligned in a certain direction. This sensing layer can be made, for example, by applying a liquid dispersion of the nanowires on a substrate and, under an applied electrical field, dry the liquid content to bind the nanowires with a hosting material. The hosting material can be a polymer, or any similarly soft and flexible materials. Other techniques for aligning the nanowires can also be employed, as long as they are effective and practical.

The sensing materials suitable for the invention include zinc oxide (ZnO) nanowires, barium titanate (BaTiO$_3$) nanowires, or carbon nanotube (CNT), etc. These nonowires or nanotubes should have a high length-to-diameter aspect ratio. For example, aspect ratio (length/diameter) of ordinary ZnO nanowires is anywhere from 10 to 1000 (typically ~5 μm long by 50 nm diameter), which makes them inherently sensitive to the bending along the length. By an internal alignment of the nanowires in one predefined direction, the piezoelectric layer would be extremely sensitive to the bending along the direction of the alignment. In other words, axis of the alignment of the nanowires determines the axis of sensitivity against bending.

Figure 3:
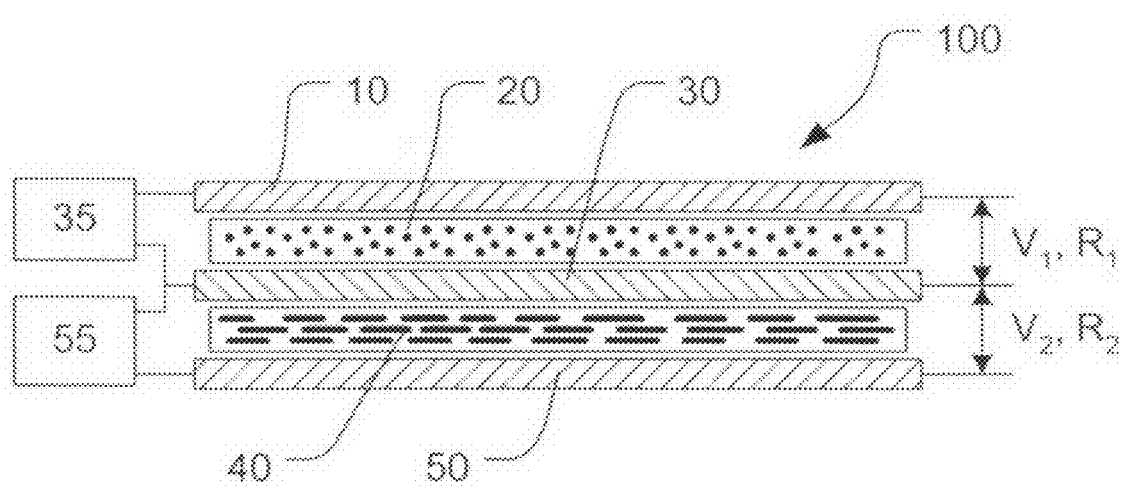
FIG. 3 is a cross sectional view of a single cell of the sensor module according to the invention.

In very minimum, the sensor module of the present invention comprises one functional unit, namely one cell. A cross sectional view of the cell is shown in FIG. 3. This cell 100 comprises a top electrode 10, a first sensing layer 20, a central electrode 30, a second sensing layer 40, and a bottom electrode 50. The first sensing layer 20 and the second sensing layer 40 comprise aligned piezoelectric nanowires. The alignment direction of the nanowires in the first sensing layer 20 and the second sensing layer 40 should at least not be parallel to each other, preferably they are in a large angle or perpendicular to each other.

When an external stress is applied on the cell to cause a deformation (bending) of the cell, in response to the bending, the first sensing layer 20 generates a first voltage $V_1$ between the top electrode 10 and the central electrode 30, or a resistance $R_1$ between the top electrode 10 and the central electrode 30 changes an amount $\Delta R_1$. Likewise, the second sensing layer 40 generates a second voltage $V_2$ between the bottom electrode 50 and the central electrode 30, or a resistance $R_2$ between the bottom electrode 50 and the central electrode 30 changes an amount $\Delta R_2$. $V_1$ (or $\Delta R_1$) and $V_2$ (or $\Delta R_2$) are measurable by circuit 35 connected to the top electrode 10 and the central electrode 30, and by circuit 55 connected to the central electrode 30 and the bottom electrode 50, respectively. Depending on the bending direction, positive/negative (+/−) charges are generated. It is thus possible to determine the direction (convex/concave) of the bending and curvature of the bending.

Figure 4:
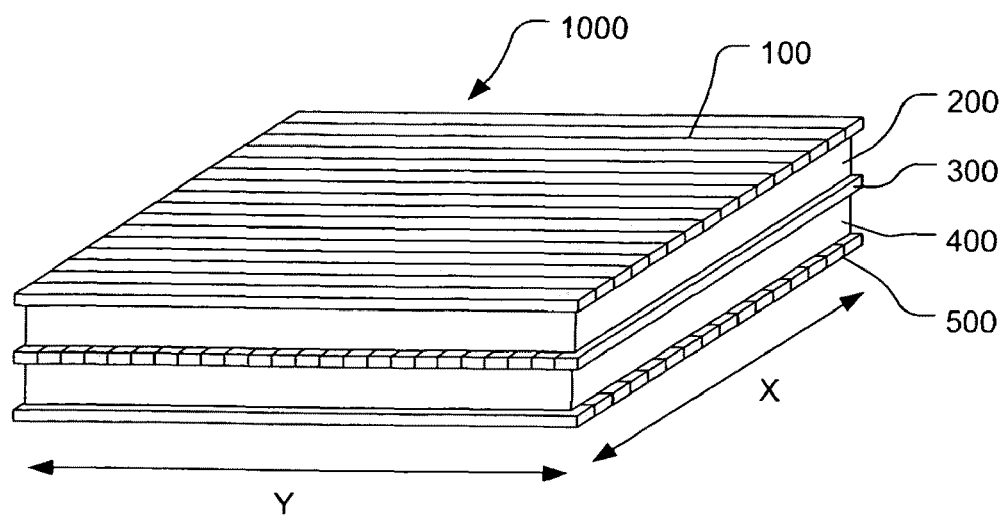
FIG. 4 is a schematic perspective view of a multi-cell sensor module according to the invention.
Figure 5:
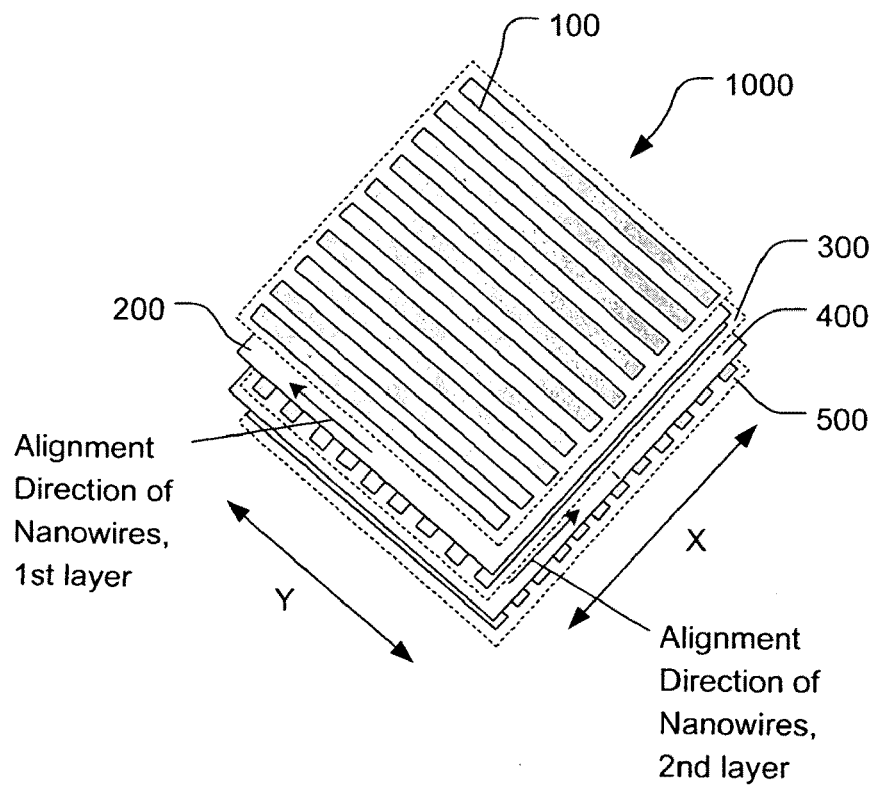
FIG. 5 is a schematic top view of the multi-cell sensor module according to the invention.
Figure 6:
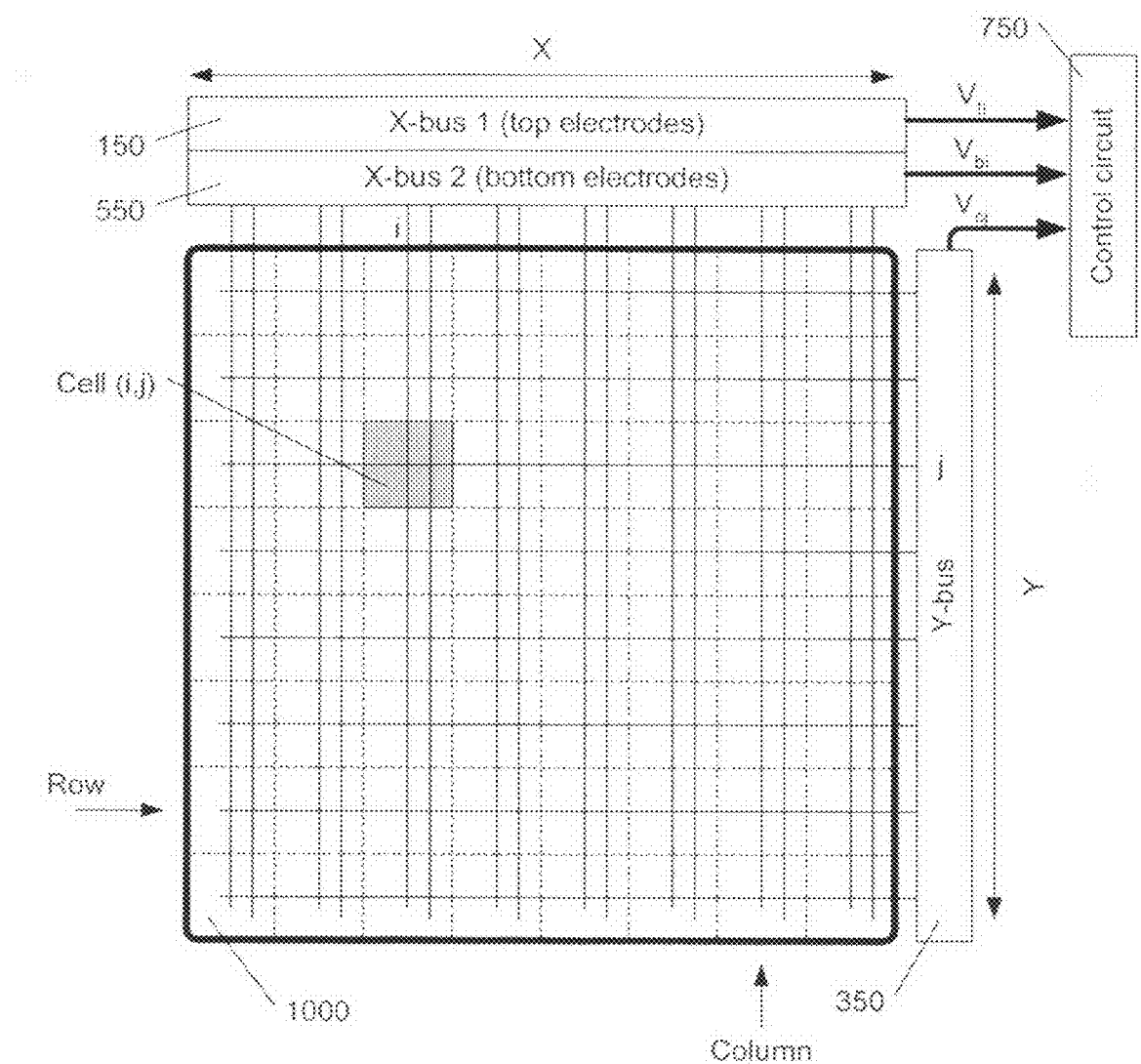
FIG. 6 is a schematic illustration of a circuit design of the sensor module according to the invention.

The sensor module of the present invention may be constructed with multiple cells. For example, the cells in the sensor module may be arranged as a two-dimensional array (N columns×M rows; N, M≧1) as shown in FIGS. 4, 5 and 6. Referring now to FIG. 4, the sensor module 1000 comprises a top electrode layer 100, a first sensing layer 200, a central electrode layer 300, a second sensing layer 400, and a bottom electrode layer 500. The top electrode layer 100 comprises a first number (N) of strip electrodes arranged parallel to each other in a first direction (e.g. along the y direction). The bottom electrode layer 500 comprises same number (N) of parallel strip electrodes arranged in the same y direction as the top electrode layer 100. Each strip electrode in the top electrode layer 100 is aligned with a respective strip electrode in the bottom electrode layer 500 across the sensing layers so that a pair of top and bottom strip electrodes covers a column of cells (see illustration in FIG. 6). The central electrode layer 300 comprises a second number (M) of parallel strip electrodes arranged in a second direction (e.g. along the x direction). The number M may be same or different from number N. Each strip electrode in the central electrode layer 300 crosses every strip electrode in the top electrode layer 100 and the bottom electrode layer 500 so that it covers a row of cells (see illustration in FIG. 6). The strip electrode layers 100, 300 and 500 may be made, for example, by patterning high conductivity metal strips on a flexible thin film substrate.

Referring now to FIG. 5, although not required, sensing layers 200 and 400 can be continuous throughout the sensor module. The alignment directions of the nanowires in sensing layers 200 and 400 with respect to the directions of the strip electrode layers are not limited, as long as the nanowire alignment direction of the first sensing layer 200 and the second sensing layer 400 are not parallel to each other. A conventional arrangement is to have these two directions perpendicular to each other. For example, as shown in FIG. 5, the nanowires in the first sensing layer 200 may be arranged to be parallel to the strip electrodes of the first electrode layer 100 in the y direction. The nanowires in the second sensing layer 400 may be arranged to be parallel to the strip electrodes of the central electrode layer 300 in the x direction. Therefore, the sensor module of the present invention contains a set of two inherently aligned piezoelectric nanowire layers capable of detecting and allocating charges for particular axes and enable detection and monitoring of complex flexural deformation in 3D.

Further, soft and conductive materials may be used to fill the space between the nanowire layers and the strip electrode layers to provide mechanical integrity of the dispersed piezoelectric nanowires and enhance the charge collection efficiency from the nanowires towards the strip-electrodes.

Referring now to FIG. 6, the array of sensing cells is networked by a double x-bus readout architecture. The strip electrodes in the top electrode layer 100 are individually connected to a first x-bus 150. The strip electrodes in the bottom electrode layer 500 are individually connected to a second x-bus 550. The strip electrodes in the central electrode layer 300 are individually connected to a y-bus 350. Buses 150, 350 and 550 are connected to a control circuit 750. For a cell (i, j) of the sensor module 1000, the control circuit 750 is configured to measure a pair of voltages $V_1(i,j)$ and $V_2(i,j)$ in which:

$$V_1(i,j)=V_{ti}-V_{cj}$$

$$V_2(i,j)=V_{bi}-V_{cj}$$

where $V_{ti}$ is the voltage of the $i^{th}$ strip electrode in the top electrode layer 100, $V_{bi}$ is the voltage of the $i^{th}$ strip electrode in the bottom electrode layer 500, and $V_{cj}$ is the voltage of the $j^{th}$ strip electrode in the central electrode layer 300.

When an external stress causing deformation is applied in vicinity of the cell (i, j), at least one of the voltages $V_1(i, j)$ and $V_2(i, j)$ is responsive to the intensity of the external stress. Data taken from the voltage measurement of the cells can be used in tracking flexural deformation of the sensor module. If the sensor module is placed in close contact with a surface, the flexural deformation of the surface may be measured by the sensor module.

Alternatively, instead of measuring voltages, resistance change in cells of the sensor module can also be used for tracking the flexural deformation. Referring again to FIG. 6, for a cell (i, j) of the sensor module 1000, the control circuit 750 may also be configured to measure a pair of resistances $R_1(i, j)$ and $R_2(i, j)$ in which $R_1(i, j)$ is the resistance between the $i^{th}$ strip electrode in the top electrode layer 100 and the $j^{th}$ strip electrode in the central electrode layer 300, $R_2(i, j)$ is the resistance between the $i^{th}$ strip electrode in the bottom electrode layer 500 and the $j^{th}$ strip electrode in the central electrode layer 300. When an external stress causing deformation is applied in vicinity of the cell (i, j), at least one of the changes of the resistances $\Delta R_1(i, j)$ and $\Delta R_2(i, j)$ is responsive to the intensity of the external stress. Data taken from the resistance change measurement of the cells can be used in tracking flexural deformation of the sensor module.

Further, the control circuit 750 may further be configured in such a way that the data measurement or readout is conducted repeatedly in a certain frequency so that the voltage or resistance data obtained are real-time data which can be used for measuring the deformation process in real time. For example, a sampling rate of ~50 Hz may be used for real-time measurement with a reasonable accuracy.

Figure 7:
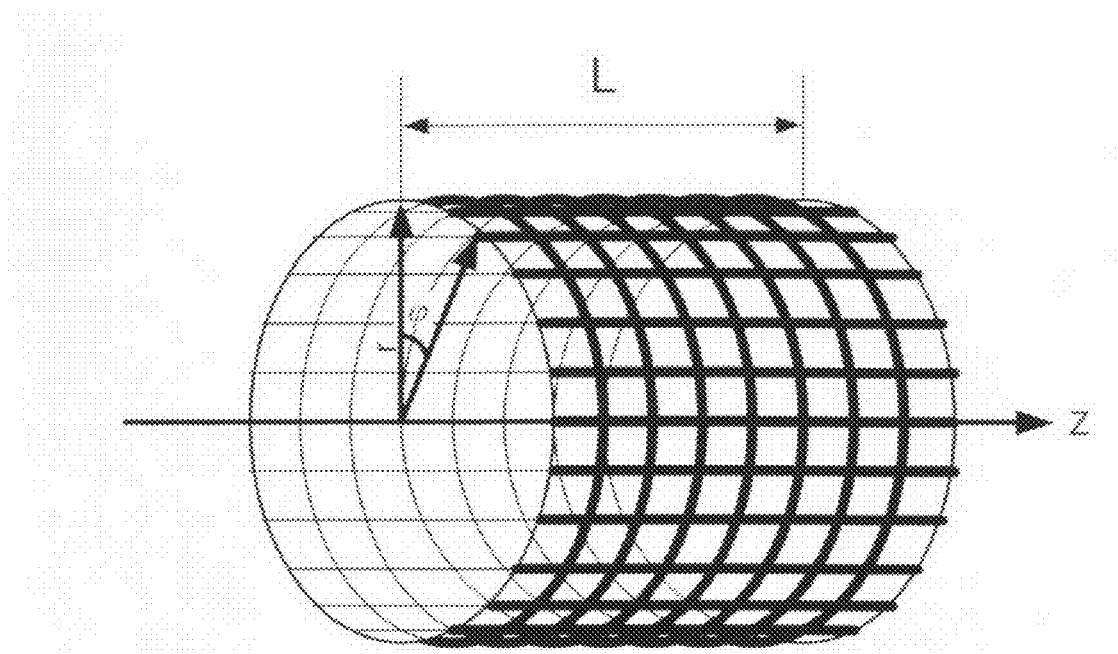
FIG. 7 is a schematic illustration of a tubular sensor module according to the invention.

Besides the two dimensional array type arrangement of the cells as described above, other shapes and arrangements of the sensor module are possible and they may be derived without departure from the scope of the invention. For example, the sensor module may be formed in a hollow tubular shape as shown in FIG. 7. The electrode layers, the sensing layers and possibly the readout buses may be arranged to be conform to the tubular shape. The tubular shaped sensor module is characterized by a radius r and a length L. Instead of using the x-y coordinates as mentioned above, a cell in the tubular sensor module may be described in two cylindrical coordinates z and $\phi$, in which z is the distance from one end of the tube along the axis of the tube and $\phi$ is an angle. Appropriate combination of the two voltage signals or two resistance change signals measured from a cell (z, $\phi$) and application of certain mathematical transformation formulas provide for detection of the 3D complex conformal deformation of the tube (see Appendix 1 for information about the cylindrical coordinate system and transformation formulas).

Figure 8:
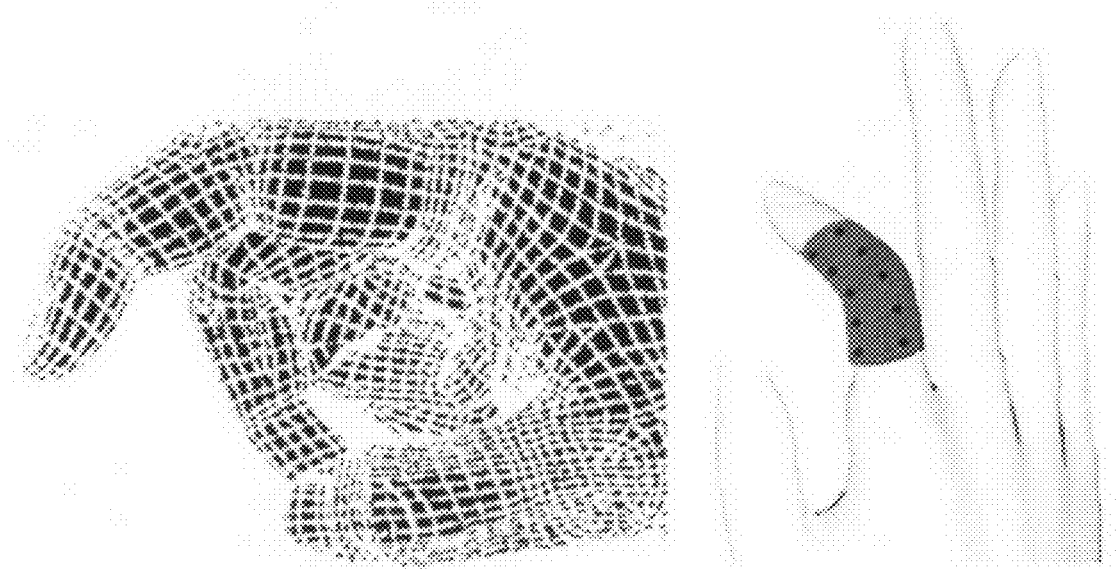
FIG. 8(*a*) is an exemplary contour map of skin deformation of a human hand.

Such a tubular shaped sensor module may be placed around a curved or cylindrical shaped surface for measuring the conformal deformation of the surface. FIG. 8(*a*) shows a contour map of skin deformation of a human hand. A hand gesture is represented by the skin deformation. The skin deformation may be detected and transformed into electrical signals for communication or device controlling. FIG. 8(*b*) shows a tubular shaped sensor module wrapping around a finger. The bending and movement of the finger may be detected by the sensor module and qualitatively transformed into electrical signals. The signals may be used as indicators for commanding an electronic device.

Because the sensor module can form many shapes possible, it can be particularly designed to fit a user's finger, arm, body, etc. The above-mentioned tubular shape is just one example. Other possible shapes and arrangements include gloves, wearable body wraps, flexible touch screens, balls, handles, etc. When a human body part that the sensor module is attached on moves, bends, squeezes or stretches, it causes the sensor module to produce certain electrical signals. If the sensor module is used as a user interface for an electronic device, the signals can be used for controlling the electronic device. Density of sensing elements (e.g. number of cells in a sensor module or number of cells in a unit area of a surface) determines the spatial resolution of the deformation measurement. In addition to using a single sensor module that comprises multiple cells, a plurality of sensor modules may be networked to form a system. A module or a system may comprise from a few cells towards hundreds of cells networked to form a so-called Flexural Sensing Layer (FSL). Right selection of cells and modules depends on the requirements for the final application and service. The simplest device might involve one or a few modules with moderate density of cells arranged on a strip, suitable for wrist watch-type user interface application, etc. Higher density of the cells ($10/cm^2$) may be used for high resolution tracking of user skin deformation.

A computer program product may be used by the electronic device for controlling the interface of the present invention. The computer program product comprises at least a computer readable storage medium storing program codes thereon for use by the electronic device. The program codes comprise instructions for measuring $V_1(i, j)$ and $V_2(i, j)$ of the cell (i, j), or $\Delta R_1(i, j)$ and $\Delta R_2(i, j)$ of the cell (i, j), and instructions for calculating a flexural deformation as a result of an external stress. The measurement may be automatically repeated in a predetermined time interval. Data taken from the measurement of the cells can be used in tracking flexural deformation of the sensor module, or as command signals for controlling the electronic device.

It is to be understood that the above-described arrangements are only illustrative of the applications of the principles of the teachings hereof. In particular, it should be understood that although only a few examples have been shown, the teachings hereof are not restricted to those examples. Numerous modifications and alternative arrangements may be devised by those skilled in the art without departing from the scope of the present disclosure.

APPENDIX 1

Mathematical Transformation for Conformal Deformation Observation

Figure 9:
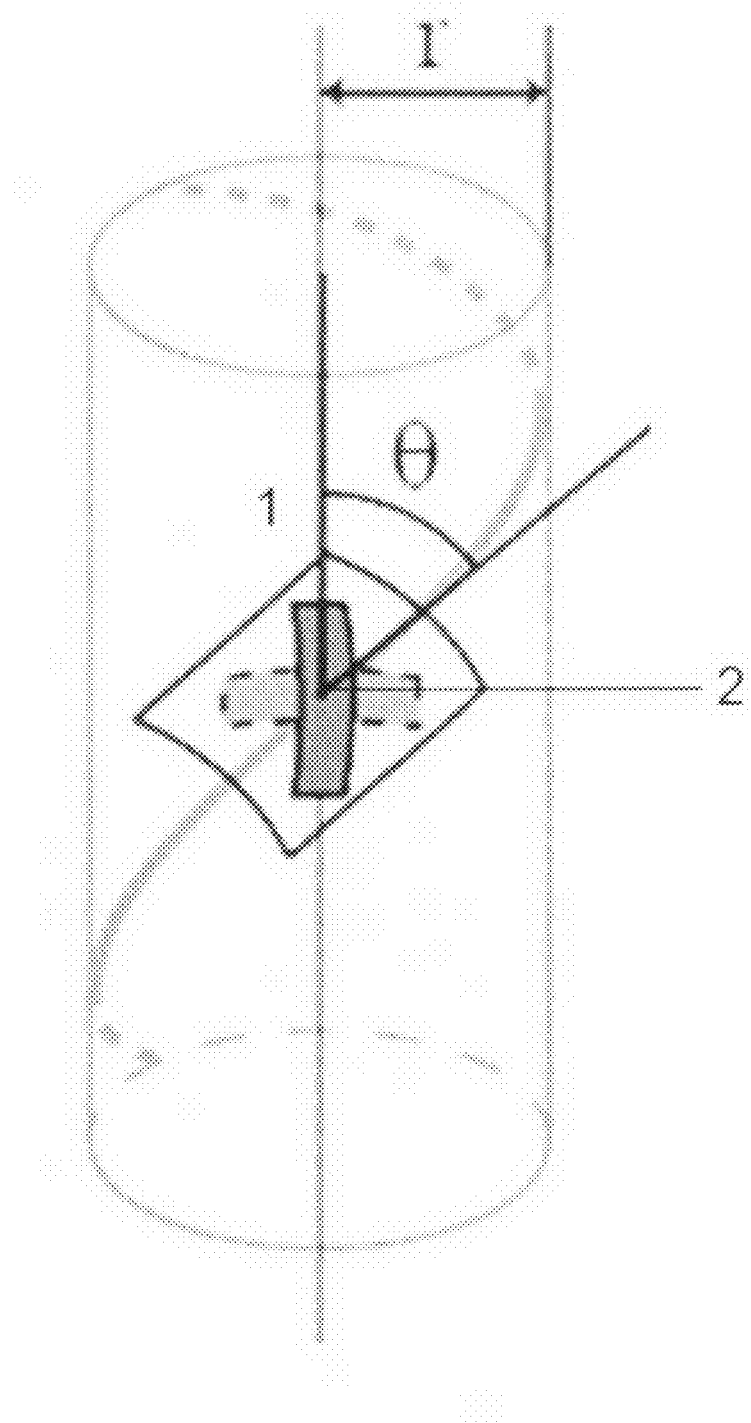
FIG. 9 is an illustration of a cylindrical coordinate system.

As described, two sensing layers are placed between three layers of strip electrodes (top/central/bottom) to enable complex deformation detection of a surface by using two axes of single directional sensitivity (directions of sensitivity are marked as 1 and 2). Single directional sensitivity is enabled by highly aligned nanowires in the sensing layers. In other words, the axes of sensitivity determine two primary directions where conformal flexing can be depicted by $\kappa_1$ and $\kappa_2$ (curvatures of bending in direction 1 and 2, respectively). For the simplicity of mathematical operations, transformation into a cylindrical coordinate system is recommended. For instance, if the sensor module is wrapped around a cylinder (see FIG. 9), curvature of the sensing layers can be expressed as:

$$\kappa_1 = \frac{1 + \sin 2\theta}{2r} \tag{4}$$

-continued $$\kappa_2 = \frac{1 - \sin 2\theta}{2r}$$

where,

θ is angle of central axis of the sensing layer to central axis of cylinder, r is radius of the cylinder, κ1 and κ2 are curvatures along directions 1 and 2, respectively.

Sensing of complex deformation can be de-convoluted by using a system with two predetermined sensing directions (1, 2). These two directions are misaligned and can be perpendicularly placed to each other. In this case when external stress and deformation is applied on the sensing layer the radius and the angle of bending can be calculated as:

$$r = \frac{C_1}{S_1 + S_2} \quad (5)$$

and $$\theta = C_2 \mathrm{Sin}^{-1}\left(C_3 \frac{S_1 - S_2}{S_1 + S_2}\right) \quad (6)$$

where ($S_1$, $S_2$) are directly measured variables (voltages and/or resistances) and $C_1$, $C_2$, $C_3$ are calibration coefficients.

The invention claimed is:

1. An apparatus, comprising at least one cell, said cell comprising:
    a first electrode,
    a central electrode, a second electrode,
    a first sensing layer placed between the first electrode and the central electrode,
    a second sensing layer placed between the central electrode and the second electrode,
    a circuit connected to the first, second and the central electrodes, said circuit being configured to measure a first electrical signal between the first electrode and the central electrode, and a second electrical signal between the second electrode and the central electrode, and
wherein at least one of the first electrical signal and the second electrical signal is responsive to an external stress applied on the cell, wherein the first sensing layer comprises piezoelectric crystallites aligned substantially in a first direction parallel to the first sensing layer, the second sensing layer comprises piezoelectric crystallites aligned substantially in a second direction parallel to the second sensing layer, and wherein the first direction and the second direction are not parallel to each other, wherein said apparatus is part of a user interface configured to accept a user input and to convert said user input into at least one of the first electrical signal and the second electrical signal, and wherein said apparatus is a flexible sensor module fitted to a part of a human body, and wherein a movement of the part of the human body produces the external stress for controlling an electronic device.

2. The apparatus of claim 1, wherein the first sensing layer and the second sensing layer each comprises a piezoelectric material.

3. The apparatus of claim 2, wherein the first sensing layer and the second sensing layer each comprises high aspect ratio crystallites of the piezoelectric material.

4. The apparatus of claim 3, wherein the high aspect ratio crystallites have a diameter of 1-100 nm and a length of 1-1000 μm.

5. The apparatus of claim 3, wherein the high aspect ratio crystallites are zinc oxide (ZnO) nanowires, barium titanate ($BaTiO_3$) nanowires, or carbon nanotubes.

6. The apparatus of claim 1, wherein the first electrical signal is a voltage difference between the first electrode and the central electrode and the second electrical signal is a voltage difference between the second electrode and the central electrode.

7. The apparatus of claim 1, wherein the first electrical signal is a change of resistance between the first electrode and the central electrode and the second electrical signal is a change of resistance between the second electrode and the central electrode.

8. The apparatus of claim 1, wherein at least one of the first electrical signal and the second electrical signal is proportional to the external stress applied on the cell.

9. The apparatus of claim 1, wherein
    the apparatus comprises a plurality of cells, said plurality of cells are arranged in a two dimensional array with a plurality of rows and a plurality of columns,
    the first and the second electrodes each comprises a plurality of strip electrodes and each strip electrode extends across a column of the cells,
    the central electrode comprises a plurality of strip electrodes and each strip electrode extends across a row of the cells,
    each of the plurality of strip electrodes of the first electrode is connected to a first bus,
    each of the plurality of strip electrodes of the second electrode is connected to a second bus,
    each of the plurality of strip electrodes of the central electrode are connected to a third bus,
    wherein the circuit is connected to each of the strip electrodes via the first, second or the third bus, and
    wherein the circuit is configured to measure the first electrical signal of each cell between the first electrode and the central electrode, and the second electrical signal of each cell between the second electrode and the central electrode.

10. The apparatus of claim 9, wherein the first sensing layer and the second sensing layer each extends across the plurality of columns and the plurality of rows, and wherein the first sensing layer comprises piezoelectric crystallites aligned substantially in a first direction parallel to the first sensing layer, the second sensing layer comprises piezoelectric crystallites aligned substantially in a second direction parallel to the second sensing layer, and wherein the first direction and the second direction are not parallel to each other.

11. The apparatus of claim 10, wherein the first direction is a direction parallel to the rows and the second direction is a direction parallel to the columns.

12. The apparatus of claim 9, wherein at least one of the first electrical signal of each cell and the second electrical signal of each cell is proportional to the external stress and said signals are used for calculating a flexural deformation of the apparatus in response to an external stress.

13. An electronic device, comprising a user interface configured to accept a user input, wherein said user interface comprises an apparatus according to claim 1, and wherein said user input is converted into at least one of the first electrical signal and the second electrical signal for communicating to the device.

14. A computer program product, comprising a computer readable storage medium storing program codes thereon for use by an electronic device, said program codes comprise:
    instructions for measuring a first electrical signal and a second electrical signal, and instructions for calculating a flexural deformation as a result of an external stress, wherein said stress is applied on a apparatus to cause said flexural deformation of said apparatus, said apparatus comprises at least one cell, said cell comprises:

a first electrode, a central electrode, a second electrode, a first sensing layer placed between the first electrode and the central electrode, a second sensing layer placed between the central electrode and the second electrode, a circuit connected to the first, second and the central electrodes, said circuit being configured to measure the first electrical signal between the first electrode and the central electrode, and the second electrical signal between the second electrode and the central electrode, and wherein at least one of the first electrical signal and the second electrical signal is generated in response to the external stress, wherein the first sensing layer comprises piezoelectric crystallites aligned substantially in a first direction parallel to the first sensing layer, the second sensing layer comprises piezoelectric crystallites aligned substantially in a second direction parallel to the second sensing layer, wherein the first direction and the second direction are not parallel to each other, wherein said apparatus is part of a user interface configured to accept a user input and to convert said user input into at least one of the first electrical signal and the second electrical signal, wherein said apparatus is a flexible sensor module fitted to a part of a human body, and wherein a movement of the part of the human body produces the external stress for controlling the electronic device.

15. The computer program product of claim 14, wherein the program codes further comprise:

instructions for using the first electrical signal and/or the second electrical signal for said controlling the electronic device.

* * * * *